United States Patent
Kawase et al.

(10) Patent No.: US 9,039,301 B2
(45) Date of Patent: May 26, 2015

(54) OPTICAL TRANSCEIVER HAVING ENHANCED EMI TOLERANCE

(71) Applicant: Sumitomo Electric Industries, Ltd., Osaka-shi, Osaka (JP)

(72) Inventors: Daisuke Kawase, Yokohama (JP); Kuniyuki Ishii, Yokohama (JP); Hiroyasu Oomori, Yokohama (JP); Hiromi Kurashima, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 232 days.

(21) Appl. No.: 13/747,854

(22) Filed: Jan. 23, 2013

(65) Prior Publication Data

US 2013/0136458 A1    May 30, 2013

Related U.S. Application Data

(63) Continuation-in-part of application No. 13/578,841, filed as application No. PCT/JP2011/079975 on Dec. 16, 2011.

(30) Foreign Application Priority Data

Dec. 20, 2010   (JP) .................................. 2010-282719
Jan. 24, 2012   (JP) .................................. 2012-011624

(51) Int. Cl.
  *G02B 6/42*    (2006.01)
  *H05K 9/00*    (2006.01)
  *H04B 10/40*   (2013.01)

(52) U.S. Cl.
  CPC .............. *H04B 10/40* (2013.01); *G02B 6/4227* (2013.01); *H05K 9/0058* (2013.01)

(58) Field of Classification Search
  CPC ............................. G02B 6/4277; H05K 9/0058
  USPC ........................................................... 361/818
  See application file for complete search history.

(56) References Cited

U.S. PATENT DOCUMENTS

| 5,766,560 | A   | 6/1998  | Cole              |         |
|-----------|-----|---------|-------------------|---------|
| 6,817,782 | B2  | 11/2004 | Togami et al.     |         |
| 6,856,769 | B1* | 2/2005  | Steffensen et al. | 398/135 |
| 7,491,090 | B2  | 2/2009  | Oki et al.        |         |
| 8,537,554 | B1  | 9/2013  | Hockaday          |         |

(Continued)

FOREIGN PATENT DOCUMENTS

| JP | 2003-270492 A | 9/2003 |
|----|---------------|--------|
| JP | 2003270492 A  | 9/2003 |
| JP | 2008-090000 A | 4/2008 |

OTHER PUBLICATIONS

Non-Final Office Action of the related (U.S. Appl. No. 13/578,841), dated Apr. 18, 2014.

(Continued)

*Primary Examiner* — Jerry Rahll
(74) *Attorney, Agent, or Firm* — Global IP Counselors, LLP

(57) ABSTRACT

An optical transceiver that attenuates the EMI radiation leaked therefrom is disclosed. The optical transceiver includes a top cover and the bottom base to form a cavity into which a TOSA, a ROSA, and a circuit are set. At least one of the top cover and the bottom base provides a combed structure in a rear portion of the optical transceiver, where the combed structure has a plurality of T-shaped fins to attenuate the EMI radiation.

13 Claims, 18 Drawing Sheets

(56) References Cited

U.S. PATENT DOCUMENTS

| | | |
|---|---|---|
| 2003/0100204 A1 | 5/2003 | Hwang |
| 2005/0089281 A1 | 4/2005 | Chiu et al. |
| 2009/0027850 A1 | 1/2009 | Lev et al. |
| 2009/0034915 A1 | 2/2009 | Oki et al. |
| 2009/0176409 A1 | 7/2009 | Oki |
| 2009/0211801 A1 | 8/2009 | Edwards et al. |
| 2010/0155932 A1 | 6/2010 | Gambino et al. |
| 2011/0013912 A1 | 1/2011 | Kalberer et al. |
| 2013/0136458 A1 | 5/2013 | Kawase et al. |

OTHER PUBLICATIONS

International Search Report of PCT/JP2011/079975, dated Mar. 21, 2012.
Chinese Office Action of the corresponding Chinese Patent Application No. 201180010203.3, dated Jan. 6, 2014.
Final Office Action of the related (U.S. Appl. No. 13/578,841), dated Dec. 3, 2014.
Notification of Reasons for Rejection of the corresponding Japanese Patent Application No. 2010-282719, dated Feb. 10, 2015.

* cited by examiner

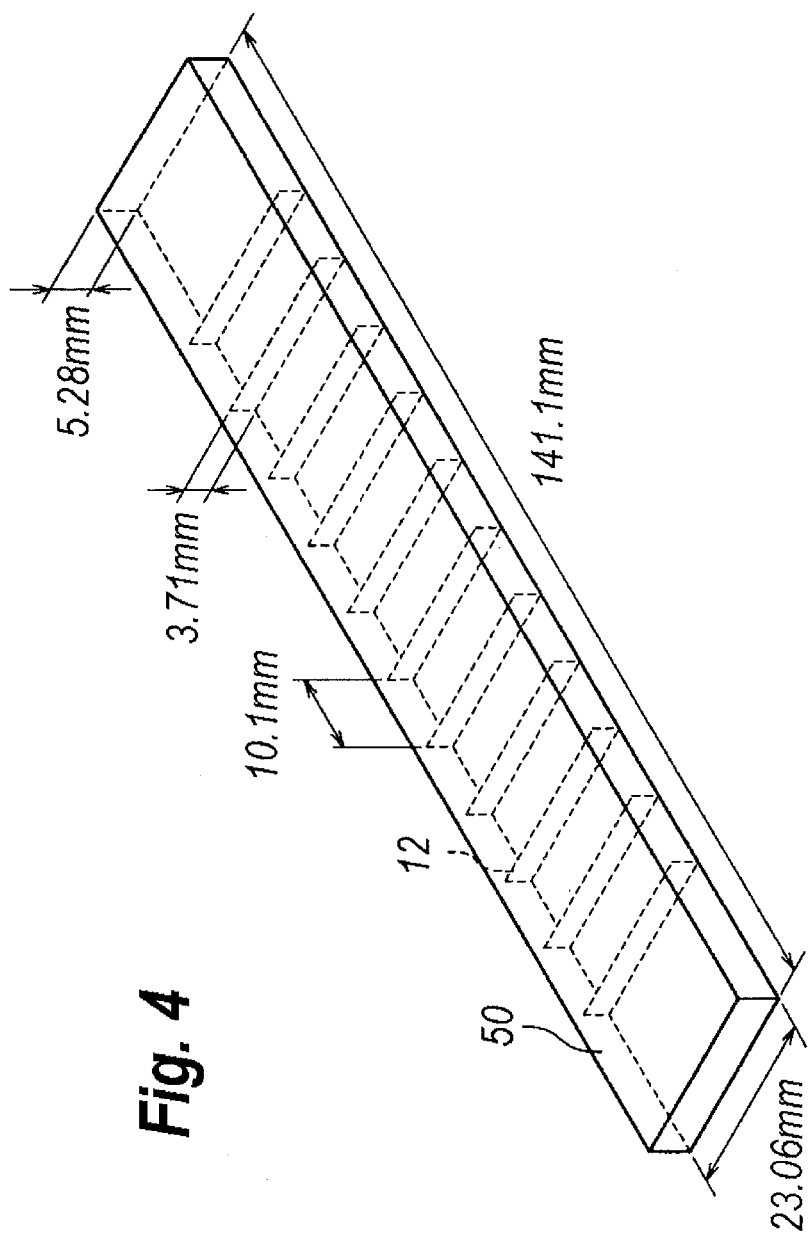

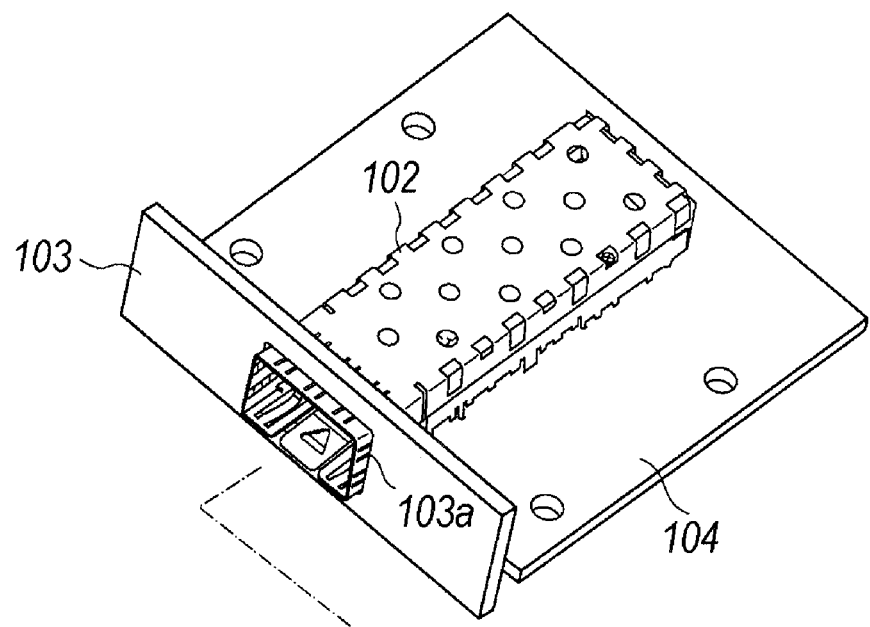
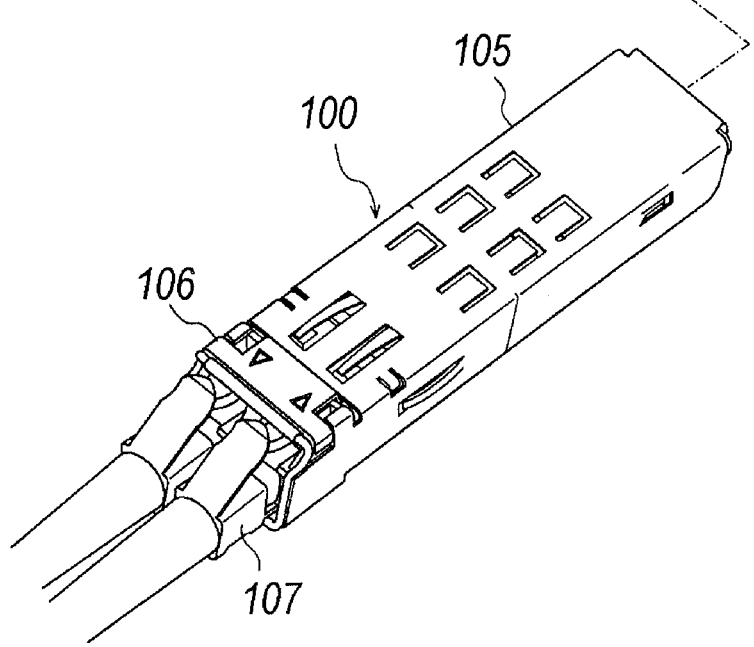
Fig. 10

*Fig. 15A*
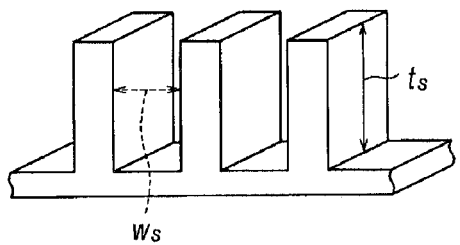
*Fig. 15B*
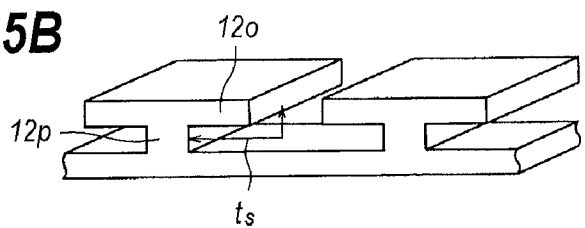
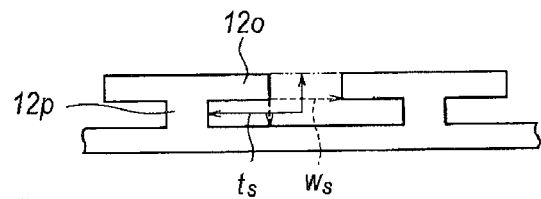
*Fig. 15C*

OPTICAL TRANSCEIVER HAVING ENHANCED EMI TOLERANCE

CROSS REFERENCE TO RELATED APPLICATIONS

This patent application is a continuation-in-part of pending prior U.S. patent application Ser. No. 13/578,841, filed Aug. 14, 2012 by Oomori et al. for OPTICAL TRANSCEIVER HAVING ENHANCED EMI TOLERANCE, which is a National Stage application of PCT/JP2011/079975, filed Dec. 16, 2011, which claims priority to Japanese Patent Application No 2010-282719, filed Dec. 20, 2010, all of which are hereby incorporated herein by reference in their entirety. This patent application also claims priority to Japanese Patent Application No. 2012-011624, filed Jan. 24, 2012, which is also hereby incorporated by reference in its entirety.

BACKGROUND OF THE INVENTION

1. Field of the Invention

The present invention relates to an optical transceiver, in particular, the invention relates to an optical transceiver with an enhanced electro-magnetic interference (hereafter denoted as EMI) tolerance.

2. Background Art

An optical transceiver generally includes a transmitter optical subassembly (hereafter denoted as TOSA) to transmit signal light, a receiver optical subassembly (hereafter denoted as ROSA) to receive another signal light, an electronic circuit communicating with the TOSA and the ROSA, and a housing to enclose the TOSA, the ROSA and the circuit therein. One type of the optical transceiver is called as the pluggable optical transceiver in which the optical transceiver may be plugged within a cage prepared in the host system without turning the electrical power of the system off.

FIG. 10 illustrates such a pluggable optical transceiver 100. The optical transceiver 100 shown in FIG. 10 is going to be set within the cage 102 on the circuit board 104 of the host system through the port 103a prepared in the face panel 103 of the system. The optical transceiver 100 provides an optical receptacle 106 in the front end thereof, into which an external optical connector 107 is set to secure the optical coupling between the external optical fiber in the optical connector 107 and active devices installed in the TOSA and the ROSA. The cage 102 provides an electrical connector in the deep end thereof. Setting the optical transceiver 100 within the cage, the electrical plug formed in the rear end of the optical transceiver 100 mates with the electrical connector in the cage to establish the communication path between the optical transceiver 100 and the host system.

The EMI radiation from electronic equipment has been a subject for a long time. Because the pluggable optical transceiver is used in an arrangement to be inserted within the cage, electro-magnetic interference (hereafter denoted as EMI) radiation may leak through a physical gap between the optical transceiver and the cage. In order to reduce such EMI radiation, the optical transceiver generally provides ground fingers or ground fins that makes in contact with the inner surface of the cage when the optical transceiver 100 is set in the cage.

A United States patent, the U.S. Pat. No. 7,491,090, has disclosed one type of elastic fingers attached to surround the optical receptacle. When the optical connector is set in the optical receptacle, the optical connector pushes the elastic finer outwardly to make in contact with the cage; while, the optical connector is released from the optical receptacle, the elastic finger is apart from the cage to facilitate the extraction of the optical transceiver from the cage. A Japanese Patent Application published as JP-2003-270492A has disclosed another type of an optical transceiver having a metal shield to fill a gap between the optical receptacle and the port.

Conventional mechanisms to reduce the EMI radiation are those described above; that is, the ground fingers surrounding the optical receptacle not only make in contact with the cage to fill the gap against the cage, or at least to narrower the gap, but also stables the chassis ground or case ground.

However, recent optical transceiver operates in a higher frequency, sometimes exceeding 10 GHz; a small gap causes the leak of the EMI radiation from the optical transceiver. For instance, misalignment between the face panel and the cage may leak the EMI radiation. Moreover, the conventional ground fingers inherently have a gap with respect to adjacent fingers, which may also cause the leak of the EMI radiation with higher frequencies. Further, the external optical connector set in the optical receptacle also forms a small gap against the inner wall of the optical receptacle. Although some optical connectors implement a member to shield such a gap, a small sized connector applied in recent systems often have no room to place such a shielding member.

Thus, a way to implement an auxiliary member to shield a small gap shows a limitation as the operating frequency becomes higher. The present invention is to provide a technique to reduce the EMI radiation from an optical transceiver independent of ways to cover the small gap.

SUMMARY OF THE INVENTION

The present application relates to an optical transceiver that comprises an optical subassembly, an electronic circuit, and a housing to enclose the optical subassembly and the electronic circuit therein. The optical subassembly may convert one of an electrical signal and an optical signal into other of an electrical signal and an optical signal. The electronic circuit, which communicates with the optical subassembly, generates EMI radiation. A feature of the optical transceiver according to the present invention is that the housing includes a combed structure to attenuate the electromagnetic radiation.

BRIEF DESCRIPTION OF DRAWINGS

Non-limiting and non-exhaustive embodiments of the present invention will be described with reference to the following figures, wherein like reference numerals refer to like parts throughout the various figures unless otherwise specified.

FIG. 4 schematically illustrates a physical model of the combed structure used to evaluate the function thereof;

FIG. 10 shows an optical transceiver and a cage prepared in the host system into which the optical transceiver is set;

FIG. 15A shows dimensions of an ordinary fin, FIG. 15B shows dimensions of a T-shaped fin, and FIG. 15C compares the ordinary shaped fin with the T-shaped fin by the height and the gap;

DESCRIPTION OF EMBODIMENTS

Next, some embodiments according to the present invention will be described as referring to accompanying drawings.

First Embodiment

Figure 1A:
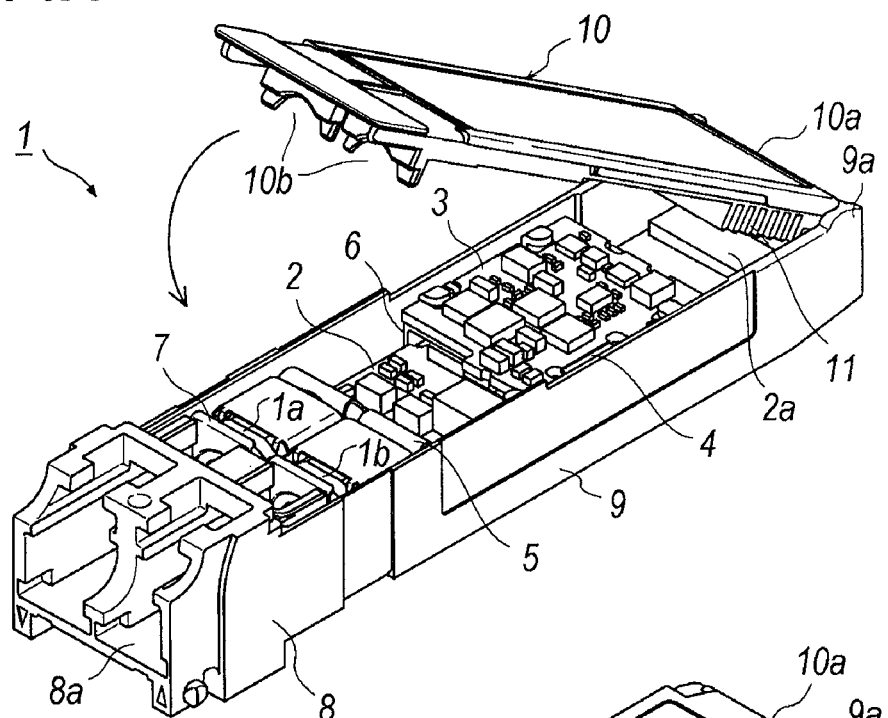
FIG. 1A is a perspective view of an optical transceiver according to an embodiment of the present invention, where the optical transceiver opens the top cover thereof.
Figure 1B:
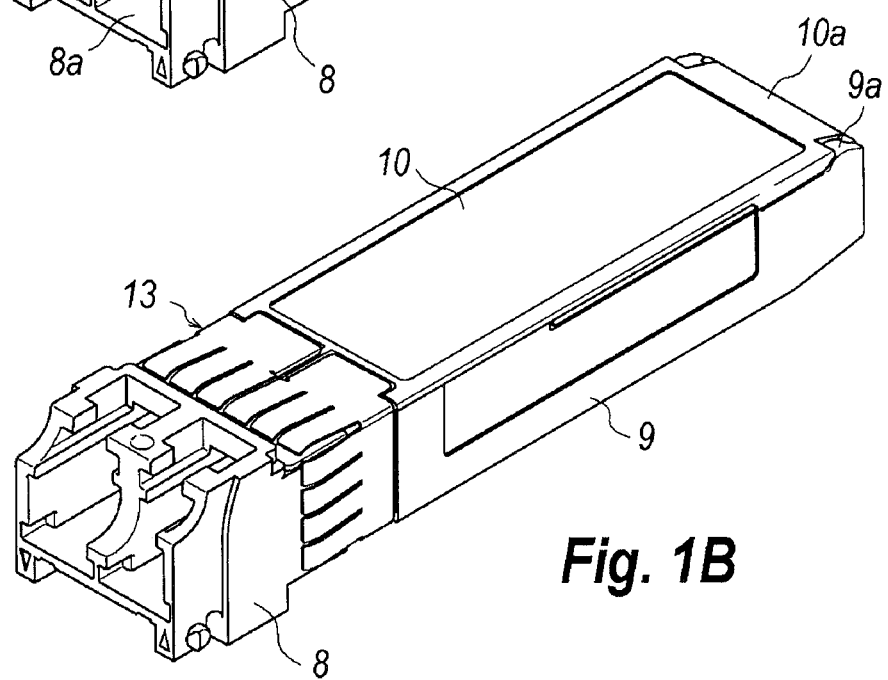
FIG. 1B is an outer appearance of the optical transceiver.
Figure 2:
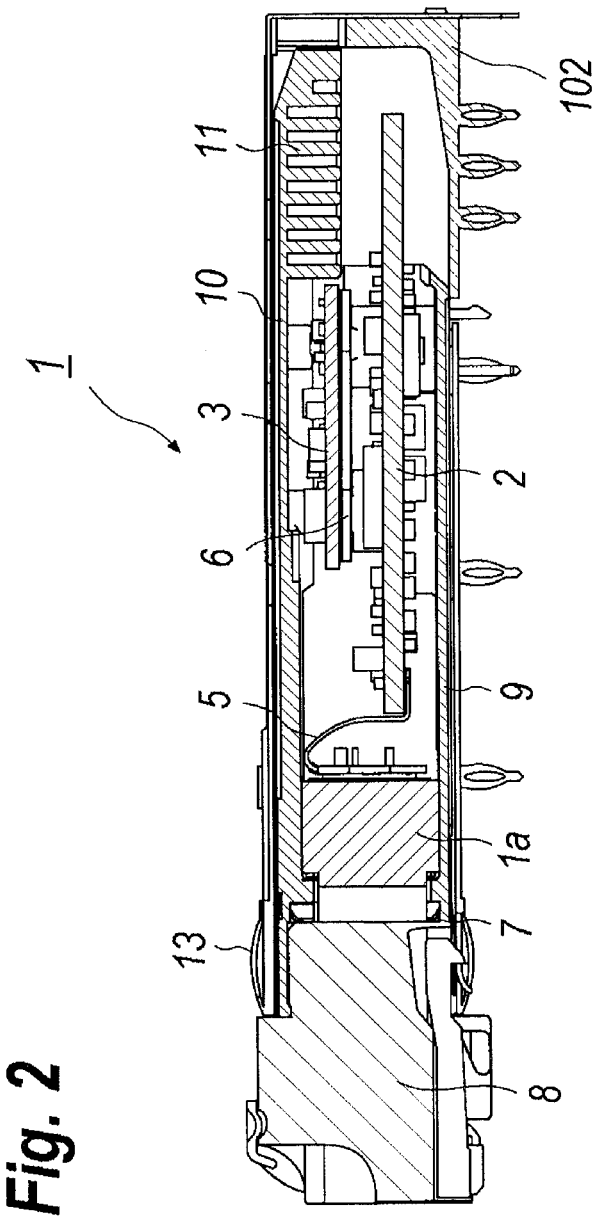
FIG. 2 is a cross section along the longitudinal axis of the optical transceiver set in the cage.

FIGS. 1A and 1B are perspective views of an optical transceiver 1 of the present invention, where FIG. 1A opens the top cover 10 thereof, while, FIG. 1B closes the top cover 10 and attaches the ground finger 13 in a front portion of the top cover 10. FIG. 2 is a cross section taken along the longitudinal axis of the optical transceiver 1, in which the optical transceiver 1 is set within a cage 102 prepared in the host system.

The optical transceiver 1 includes a TOSA 1a, a ROSA 1b, a motherboard 2, a daughter board 3, flexible printed circuit (hereafter denoted as FTC) boards 5, a shield member 7, an optical receptacle 8, a bottom base 9, the top cover 10, a combed structure 11, and the ground finger 13. The description below assumes that the "front" corresponds to a side where the optical receptacle 8 is provided, while, the "rear" is an opposite side where the combed structure and an electrical plug 2a is provided.

The TOSA 1a and the ROSA 1b are arranged in side-by-side position in the front of the optical transceiver 1 accompanied with the optical receptacle 8, which constitutes the sub-assembly unit. The TOSA 1a and the ROSA 1b install a light-emitting device and a light-receiving device therein, respectively.

The motherboard 2 and the daughter board 3 mount electronic circuits to process electrical signals for the TOSA 1a and the ROSA 1b, and other control circuits. The circuits on two boards, 2 and 3, are electrically coupled with the TOSA 1a and the ROSA 1b through FPCs 5. The holder 6 put between the motherboard 2 and the daughter board supports these two boards in a space between the bottom base 9 and the top cover 10. Another FPC board 4 drawn out from the side of respective boards, 2 and 3, connects the circuit on the motherboard 2 with those on the daughter board 3.

The motherboard 2 mounts the circuit primarily processing the signals for the TOSA 1a and the ROSA 1b, where this circuit is operated in high frequencies reaching and sometimes exceeding 10 GHz. While, the daughter board 3 mounts the circuit to control the TOSA 2, the ROSA 3, and the circuit on the mother board 2. The latter circuit on the daughter board may be operable in relatively low frequencies or substantially DC mode. Although the present embodiment has the arrangement described above, the optical transceiver 1 is not restricted to those arrangements. The daughter board 3 may mount the circuit operable in high frequencies. The rear end of the motherboard 2 provides the electrical plug 2a, which is to be engaged with the electrical connector prepared in the deep end of the cage 102. When the optical transceiver 1 is set within the cage, the electrical plug 2a is engaged with the electrical connector to secure the communication with the host system.

The shield member 7, which may be made of metal, is fit with the sleeve of the TOSA 1a, and that of the ROSA 1b, to fill a gap inherently formed between the TOSA 1a and the optical receptacle 8. The shield member 7 may put the package of the TOSA 1a, and that of the ROSA 1b, by the top and bottom plate thereof. That is, the shield member 7 may provide the front plate fit with the sleeve, and top and bottom plates each extending from the front plate and put the body of the TOSA/ROSA therebetween.

The bottom base 9 provides the optical receptacle 8 in the front portion thereof. The optical receptacle 8, which may be made of metal or resin coated with electrically conductive material, has a pair of openings 8a into which an external optical plug is fit to couple the external optical fiber with optical devices in the TOSA 1a and the ROSA 1b.

The bottom base 9, which may be made of metal, includes a bottom and a pair of sidewalls rising from respective edges of the bottom. Two boards, 2 and 3, held with the holder 6 and the shield member 7 are installed on the bottom base 9. The rear end of the bottom base 9 provides a pivot 9a to which the rear end 10a of the top cover 10 is pivotally attached.

The top cover 10, which may be made of metal, covers the space formed by the pair of sides and the bottom of the bottom base 9. The top cover 10 provides a pair of saddles 10b that press the sleeve portion of the TOSA 1a and the ROSA 1b against the bottom of the bottom base 9 when the top cover 10 is assembled with the bottom base 9. The top cover 10 in the inner surface thereof provides the combed structure 11, which will be described in detail later of the specification. The bottom base 9 and the top cover 10 constitute the housing of the optical transceiver 1.

The ground finger 13 illustrated in FIG. 1B may be made of metal sheet only by cutting and bending without soldering, welding and so on. The ground finger 13 makes in contact with the inner surface of the cage 102 when the optical transceiver 1 is set therein. The ground finger 13 may have a function to shield a gap formed between the outer surface of the optical transceiver 1 and the cage 102.

The optical transceiver 1 thus configured has the inner space formed by the bottom base 9 and the top cover 10. The inner space extends in the longitudinal direction of the transceiver 1, which may be regarded as a waveguide cavity for a microwave. The waveguide cavity whose inner space has a rectangular cross section inherently shows the cutoff frequency determined by the dimensions of the rectangular space. Electromagnetic noise whose frequency is greater than the cutoff frequency may travel in the waveguide cavity along the longitudinal direction thereof.

Figure 3A:
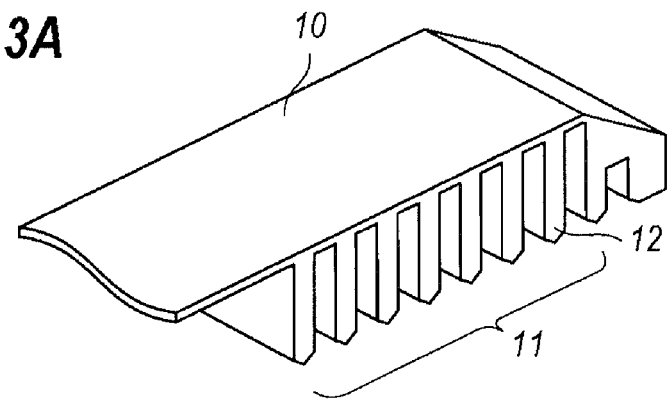
FIG. 3A is a perspective view showing a rear portion of the top cover including the combed structure.
Figure 3B:
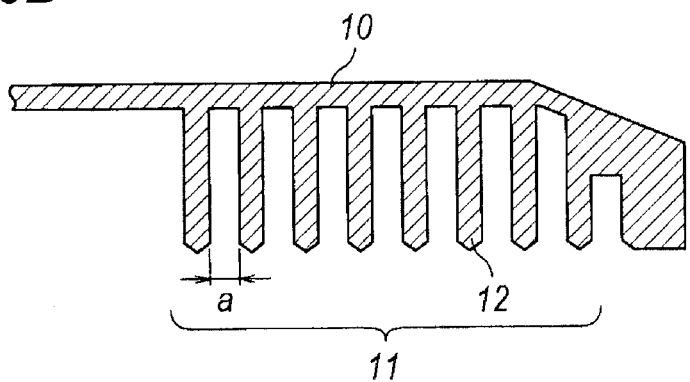
FIG. 3B is a cross section of the combed structure taken along the longitudinal axis of the optical transceiver.

FIG. 3A is a perspective view showing a rear portion of the top cover 10 including the combed structure 11 of the present embodiment, while, FIG. 3B is a cross section of the combed structure 11. The combed structure 11 shown in FIGS. 3A and 3B are formed integrally with the top cover 10 by, for instance, the metal casting. The combed structure 11 includes a plurality of fins 12 each extending laterally and downwardly. The fins 12 may function as a stub for the microwave propagating in the cavity of the optical transceiver 1. A distance a between the nearest fins 12 is preferably less than a quarter wavelength $\lambda/4$ of the noise wavelength to be suppressed.

FIG. 4 is a schematic model of the combed structure 11 to evaluate the attenuation of the noise. The metal cavity 50 has dimensions of 23.06×141.1×5.28 (W×L×H) mm$^3$ and provides the combed structure each having a height of 3.71 mm and a distance against nearest neighbors of 10.1 mm. The evaluation assumes the noise frequency of 6.56 GHz.

Figure 5:
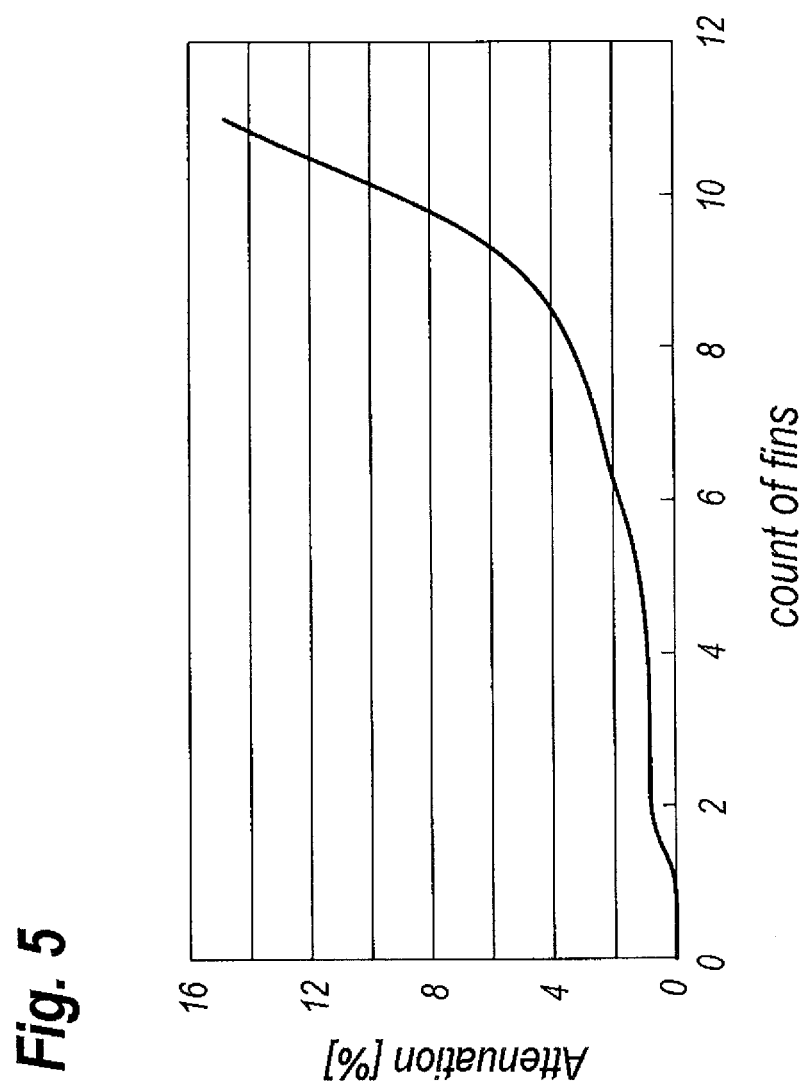
FIG. 5 shows the calculated result for the attenuation of the electromagnetic wave against the count of the fins in the combed structure.

FIG. 5 shows the result of the attenuation of the electromagnetic wave incoming from one open end of the cavity 50 and outgoing from the other end. The attenuation corresponds to a ratio of the magnitude of the latter radiation against the magnitude of the former radiation. The count 0 in the number of the fins corresponds to an arrangement where the cavity provides no fins. FIG. 5 explicitly shows that the attenuation of the electromagnetic wave increases as the count of the fins increases. In particular, the attenuation drastically increases when the count of the fins 12 exceeds 9. Moreover, the attenuation shown in FIG. 5 corresponds to a case where the frequency of 6.56 GHz is assumed; however, the lesser count of fins 12 maybe effective when the frequency of the electromagnetic wave becomes higher.

The reduction of the EMI radiation was practically measured. The EMI radiation leaked from an optical transceiver was measured in an arrangement where an optical transceiver is placed on a table in an anechoic chamber as being inserted in the cage and the EMI radiation was picked up by an antenna placed 3 m apart from the optical transceiver under tested. The optical transceiver has the dimensions of 13.6×7.3 mm$^2$ (W×H) with eight (8) fins 12 of the combed structure 11 each having 0.6×20.6×2.65 mm$^2$ (L×H) and a distance to the nearest neighbor of 0.6 mm. One of fins has lower height compared with others. The optical transceiver was operated in a speed of 10 Gbps.

Measuring the EMI radiation at 20.625 GHz, leaked power of 40.0 dBμV/m was measured for the convention optical transceiver without any combed structure, while, the power of 35.7 dBμV/m was picked up for the optical transceiver of the embodiment with the combed structure. Thus, about 37% (4.3 dB) improvement was achieved in the reduction of the EMI radiation. Moreover, the maximum power was obtained when the optical transceiver, both of the conventional and the present embodiment, faced the optical receptacle thereof toward the antenna.

Figure 6A:
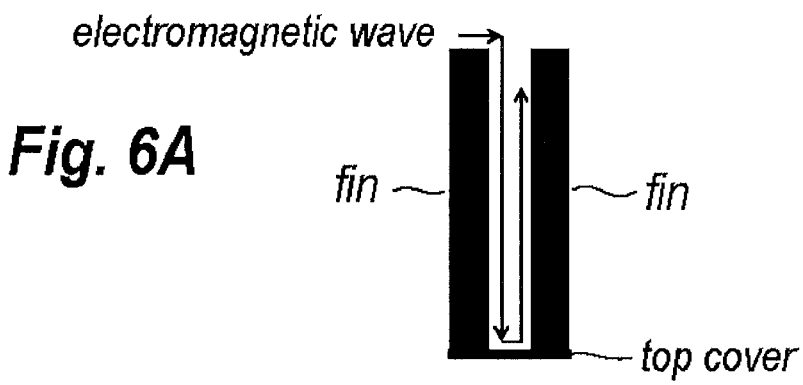
FIGS. 6A and 6B schematically explain how the H-field vector of the electromagnetic wave is attenuated by the combed structure.
Figure 6B:
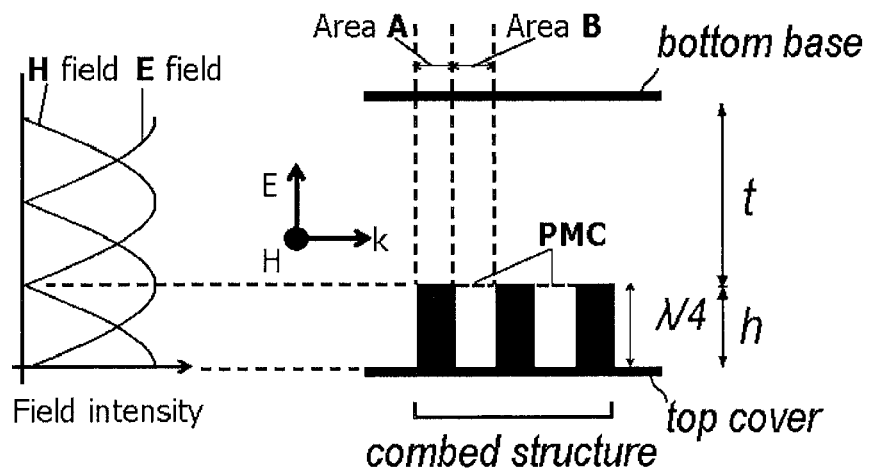

FIGS. 6A and 6B schematically illustrate a mechanism to reduce the radiation noise by the combed structure. Assuming that the electromagnetic wave propagates along the longitudinal direction of the optical transceiver and the height of respective fins of the combed structure is equal to the quarter wavelength $\lambda/4$ of the electromagnetic wave under consideration, the gap between the fins may behave as the short stub. That is, the area B appearing in FIG. 6B corresponding to the gap between the fins 12 may operate as a perfect magnetic conductor (PMC) for the H-field vector of the electromagnetic wave, because the H-field vector may cancel between the wave propagating along the longitudinal direction and that reflected by the bottom of the gap, which may be regarded as the short stub.

On the other hand, because the area A just above the fins 12 ideally behaves as the perfect electric conductor for the E-filed vector, the cut-off frequency fc in the area A may be determined by the width of the cavity:

$$fc = c/2/W,$$

where c is the velocity of light and W is the width of the cavity. The cut-off frequency fc' in the area B may be evaluated as:

$$fc' = fc*\sqrt{\{1+(W/2/t)^2\}},$$

where t is a length from the top of the fin to the bottom base, namely, a height of the reset space for the H-field vector. Thus, the cut-off frequency fc' in the area B always exceeds that in the area A. When the width W, the height of the fin h, and the length t of the rest space are 10.67 mm, 2.65 mm, and 1.65 mm, the cut-off frequency fc in the area A becomes 14 GHz but that fc' in the area B may be estimated as 47.6 GHz, which is about three times greater than that in the area A. The height h of 2.65 mm for the fin 12 corresponds to the frequency of 28.3 GHz. Specifically, when the electromagnetic wave has a frequency component of about 20 GHz, this component may propagate in the area A but may be blocked in the area B. Thus, the combed structure 11 may attenuate the electromagnetic wave whose frequency components are in a range of the operating frequency of the optical transceiver.

Figure 7:
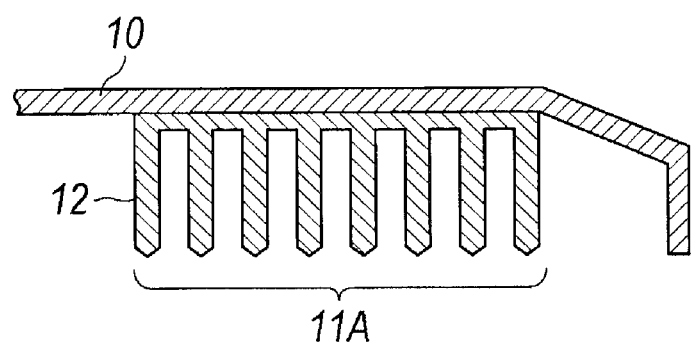
FIG. 7 is a cross section of a modified combed structure.

Some modifications of the combed structure 11 will be described. FIG. 7 is a cross section of a modified combed structure 11A. The combed structure 11A shown in FIG. 7 is independently formed from the top cover 10 but has the depth of the gap between neighbor fins is designed in a manner similar to those already explained. The modified embodiment shown in FIG. 7 inherently has a merit that, although the top cover 10 in the former embodiment is necessary to be varied as the operating frequency of the optical transceiver 1 changes, the modified combed structure 11A may be applicable for various operating frequencies by preparing several designs and changing one of combed structures depending on the operating frequency. Thus, the modified combed structure 11A may reduce the cost of the optical transceiver.

Figure 8:
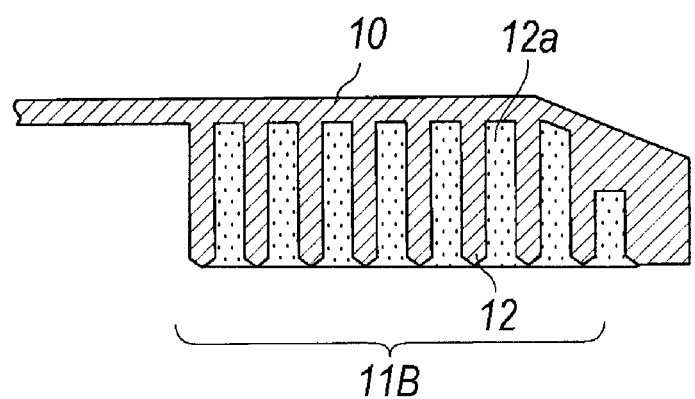
FIG. 8 is a cross section of another modified combed structure.

FIG. 8 is a cross section of still another combed structure 11B. The combed structure 11B has a feature that respective gap between fins are filled with a dielectric material 12a such as, for instance, a type of glass member. The combed structure 11B shown in FIG. 8 may lower the characteristic frequency determined by the depth of the gap.

Figure 9:
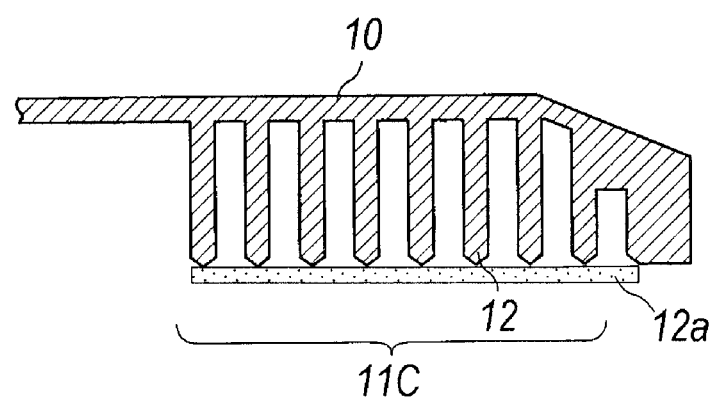
FIG. 9 is a cross section of still another modified combed structure.

FIG. 9 is a cross section of still another combed structure 11C. The combed structure 11C has a feature that a dielectric film covers the primary portion of the combed structure 11C but the gap between fins is left vacant. The embodiment 11C shown in FIG. 9 may also lower the characteristic frequency determined by the depth of the gap.

Second Embodiment

Figure 11A:
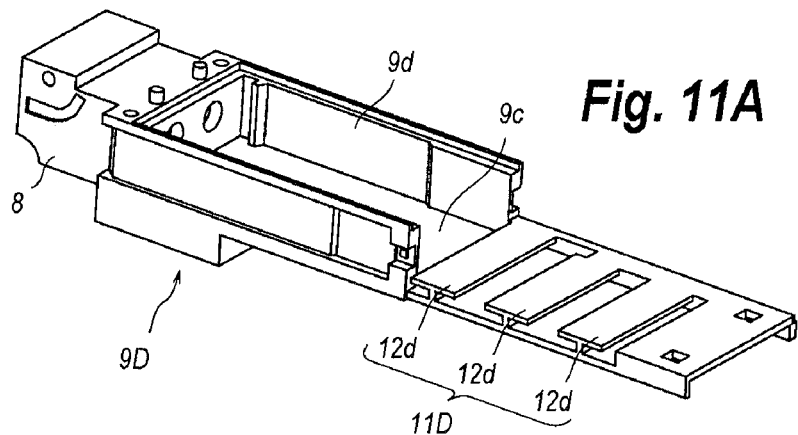
FIG. 11A is a perspective view of the bottom base.

FIG. 11A is a perspective view showing still another embodiment of the according to the present invention. A feature of the present embodiment is that the bottom base 9D provides in a rear portion of the bottom plate 9c thereof close to the electrical plug a modified combed structure 11D including a plurality of fins, while, the top cover 10D also provides in the rear portion of the top plate 10c thereof corresponding to the rear portion of the bottom base 9D the combed structure 11D with a plurality of fins 12d. These combed structure 11D is covered by rear cover 9e assembled with the bottom base 9D in the side 9d thereof. The bottom base 9D, the top cover 10D, and the rear cover 9e are also made of metal to realize the functions of the heat conduction and the EMI shield.

Figure 11B:
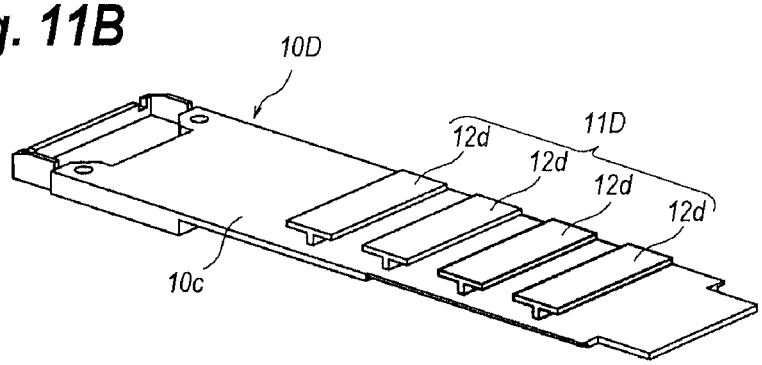
FIG. 11B is a perspective view of the top cover.
Figure 11C:
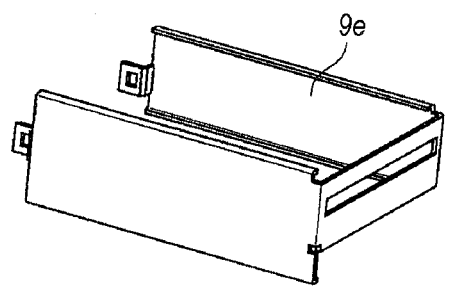
FIG. 11C is a perspective view of the rear cover of the optical transceiver according to another embodiment of the invention.
Figure 12A:
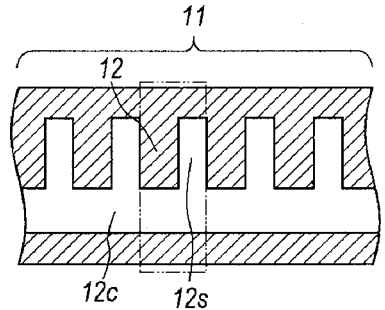
FIG. 12A is a cross section of the combed structure viewed from the side and FIG. 12B is a cross section of the combed structure viewed from the front.
Figure 12B:
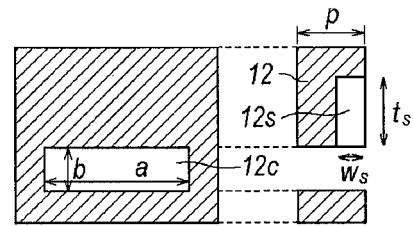

Each of the fins 12d has a cross section of the T-shape viewed from the side of the optical transceiver. The combed structure 11D shown in FIGS. 11A and 11B has the function to attenuate the EMI radiation propagating along the longitudinal direction of the housing. The embodiment shown in FIGS. 12A and 12B provides the combed structure 11D in both the top plate 10c and the bottom plate 9c. However, only one of the plates, 9c and 9d, may provide the combed structure 11D.

Figure 12C:
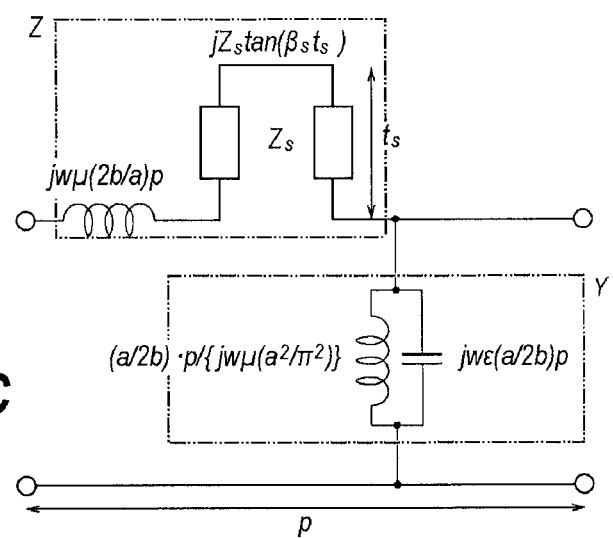
FIG. 12C is an equivalent circuit for one fin of the combed structure.

Next, a mechanism to attenuate the EMI radiation by the T-shaped combed structure 11D is described. FIGS. 12A to 12C explains the mechanism to attenuate the EMI radiation by the fin shaped combed structure, where FIG. 12A is a cross section of the combed structure 11D taken along the longitudinal axis of the optical transceiver, FIG. 12B defines the dimensions of the fin shaped combed structure 12, and FIG. 5C is an equivalent circuit model of the fin shaped combed structure 12.

The housing of the optical transceiver 1 constitutes a waveguide in a cavity surrounded by the top plate 10c, bottom plate 9c, sides 9d, and the rear cover 9e. Electro-magnetic noises with frequencies exceeding the cut-off frequency determined by the dimensions of the cavity propagate within the cavity. FIGS. 12A and 12B show cross sections of the fin 12 viewed from the side and front of the optical transceiver, respectively. The explanations below assumes the width and the height of the cavity 12c are a and b, respectively, and the height, the gap to the next fin, and the pitch of the fin are $t_s$, $w_s$, and p, respectively. Then, the effective permeability $\mu_{\mathit{eff}}$ is given by:

$$\mu_{\mathit{eff}}(H/M) = Z'/j\omega = \mu(2b/a) + Z_s \cdot \tan(\beta_s \cdot t_s)/\omega_p,$$

$$Z_s(\omega) = (2w_s/a) \cdot (\omega\mu/\beta_s), \text{ and}$$

$$\beta_s = [\{\omega/(c/(\epsilon_r \cdot \mu_r)^{1/2})\}^2 - (\pi/a)^2]^{1/2}, \quad (1)$$

where $\mu_r$ and $\epsilon_r$ are the relative permeability and relative dielectric constant of the space 12s, respectively; $\mu$(H/m) and $\epsilon$(C/m) are the permeability and the dielectric constant of the air, respectively; $\omega(=2\pi f)$ is a frequency; c(m/s) is the velocity of light; and j is the imaginary unit ($j^2 = -1$). Z' means the impedance for the unit length of the combed structure 12 at the frequency, while, $Z_s$ is the impedance for the space 12s. The effective dielectric constant is given by:

$$\epsilon_{\mathit{eff}}(C/m) = Y'/j\omega = \epsilon \cdot \{1 - (f_c/f)\} \cdot (a/2b), \quad (2)$$

where Y' is the admittance for the unit length of the combed structure 11; and $f_c(=1/(2a))$ is the cut-off frequency of the cavity. Then, the equivalent circuit of the fin 12 is those given by FIG. 12C.

Figure 13:
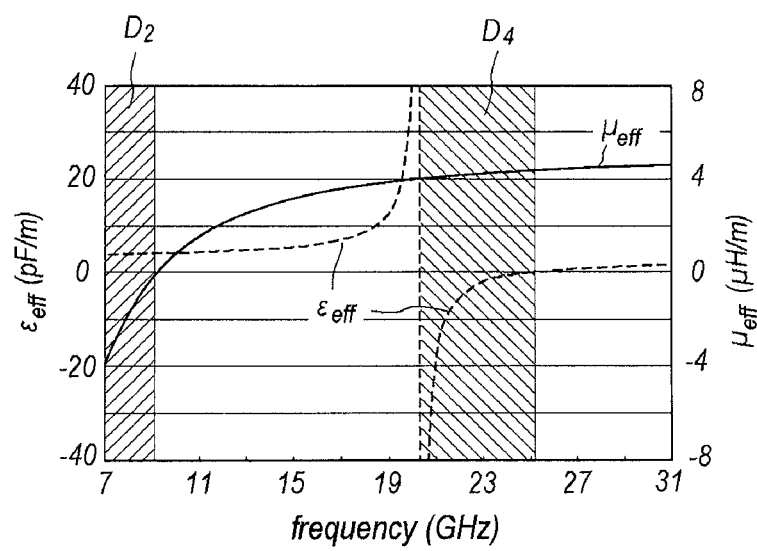
FIG. 13 shows a relation of the effective dielectric constant $\epsilon_{eff}$ and the effective permeability $\mu_{err}$ of the combed structure against the frequency.

FIG. 13 shows the dependence of the relative permeability $\mu_{\mathit{eff}}$ and the relative dielectric constant $\epsilon_{\mathit{eff}}$ of the combed structure 11 above described against frequencies. Dimensions used in this calculation are summarized below.

a 0.0164 m b 0.00288 m p 0.0021 m $w_s$ 0.0014 m $t_s$ 0.004125 m

The former parameter $\mu_{\mathit{eff}}$ calculated to be negating in a region $D_2$, while, the latter $\epsilon_{\mathit{eff}}$ is calculated to be negative in a region $D_4$. The EMI radiation cannot propagate in the waveguide of the cavity, that is, these regions, $D_2$ and $D_4$, corresponds to an area where the frequency is less than the cut-off frequency $f_c$ of the waveguide.

However, the cut-off frequency $f_c$ is simply determined by the width a of the cavity, $f_c = 1/(2a)$, and the width a is unable to modify in an optical transceiver whose dimensions follow the standard. On the other hand, for the relative permeability $\mu_{\mathit{eff}}$ may be adjustable by the design of the combed structure 11.

$$\mu_{\mathit{eff}}(H/m) = Z'/j\omega = \mu(2b/a) + Z_s \cdot \tan(\beta_s \cdot t_s)/\omega_p,$$

$$Z_s(\Omega) = (2w_s/a) \cdot (\omega\mu/\beta_s), \text{ and}$$

$$\beta_s = [\{\omega/c/(\epsilon_r \cdot \mu_r)^{1/2})\}^2 - (\pi/a)^2]^{1/2}, \quad (3)$$

Equation (1) becomes unstable when the product $\beta_s \cdot t_s$ becomes $\pi/2$, or in a regions where the product $\beta_s \cdot t_s$ is between $\pi/2$ and $\pi$, between $3\pi/2$ and $2\pi$, and so on. Assuming a condition where the product $\beta_s \cdot t_s$ is $\pi/2$ for the explanation sake, then the critical frequency $f_{OPEN}$ where the combed structure 11 operates as an open stub is given by:

$$f_{OPEN} = \omega_{OPEN}/2/\pi = c \cdot \{1/(2t_s)^2 + 1/a^2\}^{1/2}/\{2 \cdot (\epsilon_r \cdot \mu_r)^{1/2}\}. \quad (4)$$

That is, assuming the width a of the cavity is enough large, namely, ignoring the second term $1/a^2$ of the parenthesis compared with the first term $1/(2t_s)^2$, the height of the fin of the combed structure 11 is simply given by:

$$t_s = c/4/f_{OPEN} = \lambda_{OPEN}/4, \quad (5)$$

where $\lambda_{OPEN}$ is the wavelength of the EMI radiation to be attenuated. Moreover, filling the gap 12s between the fin 12 with a dielectric material, or a magnetic material, which increases the relative permeability $\mu_r$, or the relative dielectric constant $\epsilon_r$, the height $t_s$ of the fin may be equivalently shortened. Polyimide whose dielectric constant is 3.2 at 10 GHZ, Liquid Crystal Polymer (LCP) whose dielectric constant is 2.9 at 25 GHz, acrylic resin for heat dissipation whose dielectric constant is around 4.4 at 1 MHz, and so on may be used as the filler for the gap 12s. The combed structure 11 with such gaps filled with the filler makes the height of the fin 12 half, or 0.6 times as tall as that of the fin without any filler.

Elimination rate of the EMI radiation will be explained. Equation below relates the number of the fins 12 in the combed structure with the attenuation of the EMI radiation. Setting $A_{IN}$ and $A_{OUT}$ are the magnitude of the input and output radiations, respectively, and N is the number of fins, the relation between two magnitudes, $A_{IN}$ and $A_{OUT}$ are given by:

$$A_{OUT} = A_{IN} \cdot \exp(-\alpha N),$$

$$\alpha = \cos h^{-1}(|1 + ZY/2|)/p, \quad 6)$$

where $\alpha$ is the extinction co-efficient, Z and Y are the impedance and the admittance of one fin with one space, and p is the pitch of the combed structure 11.

Figure 14:
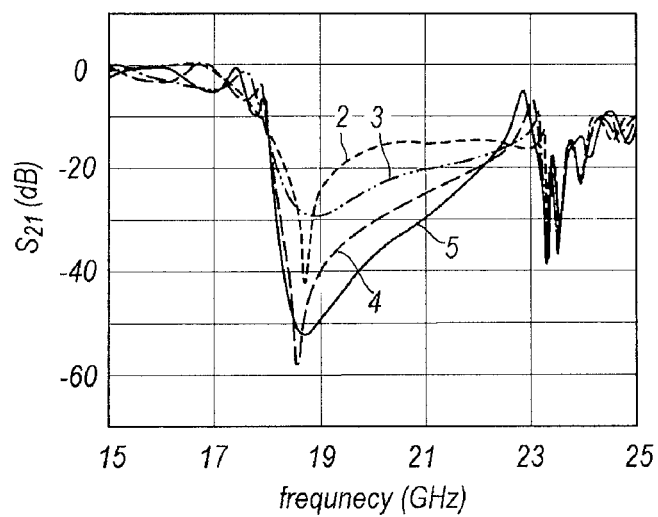
FIG. 14 compares the attenuation effect of the EMI radiation by the number of fins.

That is, as increasing the number of fins 12, the attenuation of the EMI radiation becomes strengthened. FIG. 14 shows behaviors of the attenuation as varying the number of fins 12. The calculation is carried out by the assumption that the arrangement of the combed structure is those shown in FIGS.

12A and 12B with dimensions listed above and by the finite difference time domain (FDTD) method. A condition where the attenuation of the EMI radiation greater than −30 dB and the wavelength band wider than 2 GHz are preferable for a practical optical transceiver. Referring FIG. 14, the combed structure 11 with fins more than four (4) satisfies this condition.

In a practical optical transceiver, the height of the fin 12 is preferably short as possible to secure the cavity within the housing for an area to install electronic and optical components therein. A T-shaped fin instead of the ordinary fin is one of solutions to secure the wide cavity, or to shorten the height of the fin. FIGS. 15A and 15B compare the dimensions of the ordinary fin (FIG. 15A) and the T-shaped fin (FIG. 15B). The height $t_s$ of the fin 12 is roughly reflected in the T-shaped fin by a summed length of a length and a thickness of the overhang 12o, a half of the gap to the next overhang and a half of the height of the post 12p. The gap $w_s$ of the ordinary fin is reflected in the T-shaped fin by a gap to the neighbor overhang and the height of the post 12p, as illustrated in FIG. 15C.

Figure 16:
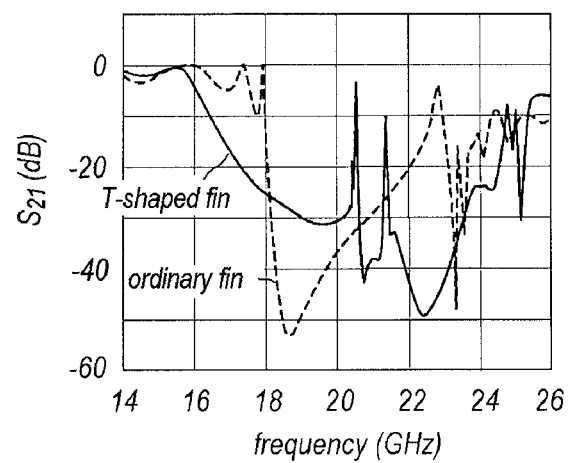
FIG. 16 compares the attenuation of the EMI radiation by the ordinary fin with that by the T-shaped fin.
Figure 17A:
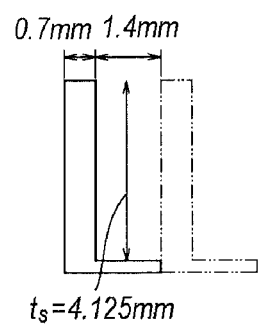
FIG. 17A shows dimensions of the ordinary shaped fin.
Figure 17B:
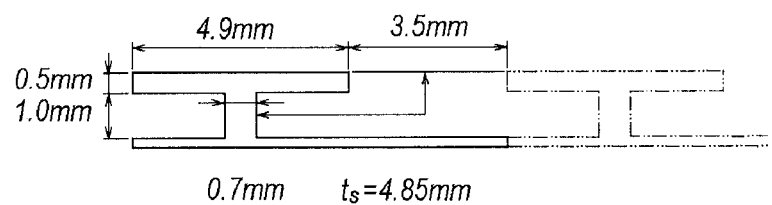
FIG. 17B shows dimensions of the T-shaped fin.
Figure 17C:
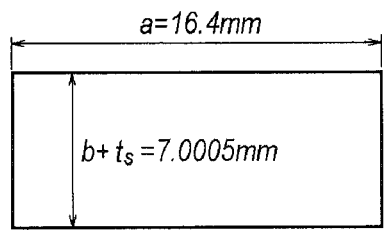
FIG. 17C is dimensions of the cavity, where those dimensions are used in the comparison shown in FIG. 16.

FIG. 16 compares the attenuation of the EMI radiation by the combed structure 11 with the ordinary fins shown in FIG. 15A with the attenuation by the T-shaped fins shown in FIG. 15B. Dimensions of the ordinary fins, those of the T-shaped fines, and those of the waveguide, namely, the cross section of the housing of the optical transceiver, are shown in FIGS. 17A to 17C. The number of fins is assumed to be five (5) and no filler is filled in the gap.

The T-shaped fins show the function substantially same with that of the ordinary shaped fins, that is, the frequency bandwidth and the attenuation degree are substantially same in both fins. Because the height of the T-shaped fins is less than the height of the ordinary fins, a wider cavity may be secured for the electronic and optical components of the optical transceiver 1.

Figure 18:
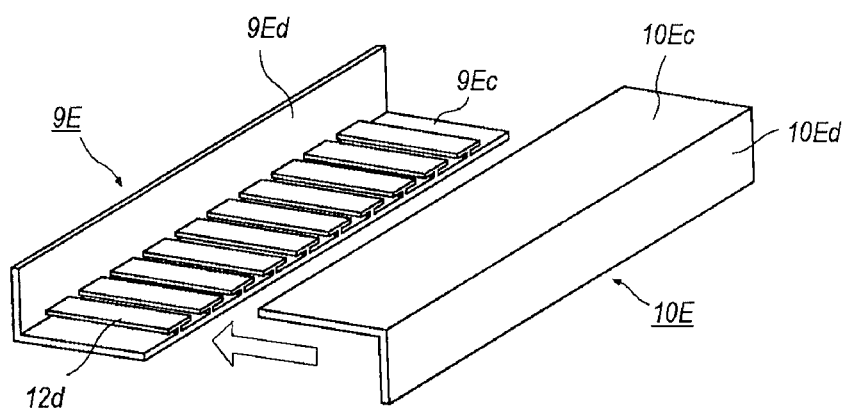
FIG. 18 is a perspective view of the bottom base and the top cover according to an embodiment modified from those shown in FIGS. 11A and 11B.

FIG. 18 is a perspective view showing a modification of the housing of the optical transceiver 1 that implements with the T-shaped fins 12d for the combed structure 11. Only the bottom plate 9Ec provides the T-shaped fins 12d in the present embodiment. Moreover, the bottom base 9E and the top cover 10E each has the L-shaped cross section formed by the side 9Ed and the bottom base 9Ec, or the side 10Ed and the top plate 10Ec. Because the T-shaped fins 12d have the overhang, a process to form such an overhung shape becomes complex when the bottom base 9E, in the sides 9Ec thereof put the T-shaped fins 12d therebetween. The L-shaped bottom base 9E shown in FIG. 18 opens the side of the T-shaped fins 12d, the process to form the fins becomes simple.

In the foregoing detailed description, the method and apparatus of the present invention have been described with reference to specific exemplary embodiments thereof. However, it will be evident that various modifications and changes may be made thereto without departing from the broader spirit and scope of the present invention. The present specification and figures are accordingly to be regarded as illustrative rather than restrictive.

What is claimed is:

1. An optical transceiver, comprising:
    an optical subassembly for converting one of an electrical signal and an optical signal into other of an electrical signal and an optical signal;
    an electronic circuit to communicate with the optical subassembly, the electronic circuit generating electromagnetic interference (EMI) radiation; and
    a housing made of electrically conductive material, the housing enclosing the optical subassembly and the electronic circuit,
    wherein the housing includes a combed structure with a T-shaped fin formed by an overhang and a post to attenuate the EMI radiation.

2. The optical transceiver of claim 1,
    wherein the housing includes a top cover and a bottom base, and
    wherein at least one of top cover and the bottom cover includes the combed structure.

3. The optical transceiver of claim 1,
    wherein the combed structure includes at least two T-shaped fins with a gap between neighbor overhangs.

4. The optical transceiver of claim 3,
    wherein the gap filled with a dielectric material.

5. The optical transceiver of claim 4,
    wherein the dielectric material is one of a polyimide, a liquid crystal polymer and an acrylic resin.

6. The optical transceiver of claim 3,
    wherein the T-shaped fin and the gap determines a wavelength of the EMI radiation to be attenuated by a total dimension of a length of the overhang, a thickness of the overhang, a half of the post, and a half of the gap to neighbor overhang.

7. An optical communication apparatus, comprising:
    a host system providing a metal cage; and
    an optical transceiver set in the metal cage, wherein the optical transceiver includes,
        an optical subassembly for converting one of an electrical signal and an optical signal into other of an electrical signal and an optical signal,
        an electronic circuit to communicate with the optical subassembly, the electronic circuit generating electromagnetic interference (EMI) radiation,
        a housing made of electrically conductive material, the housing enclosing the optical subassembly and the electronic circuit, and
        a ground finger making in contact with the metal cage,
    wherein the housing includes a combed structure with a T-shaped fin including an overhang supported by a post to attenuate the EMI radiation.

8. The optical communication apparatus of claim 7,
    wherein the housing includes a top cover and a bottom base, and
    wherein at least one of the top cover and the bottom base provides the combed structure.

9. The optical communication apparatus of claim 7,
    wherein the combed structure includes a plurality of T-shaped fins each forming a gap with respect to the neighbor overhang.

10. The optical communication apparatus of claim 9,
    wherein the gap filled with a dielectric material.

11. The optical communication apparatus of claim 10,
    wherein the dielectric material is one of a polyimide, a liquid crystal polymer and an acrylic resin.

12. The optical communication apparatus of claim 9,
    wherein the T-shaped fin and the gap to the neighbor overhang determines a wavelength of the EMI radiation to be attenuated by a total dimension of a length of the overhang, a thickness of the overhang, a half of the post, and a half of the gap to the neighbor overhang.

13. The optical communication apparatus of claim 7,
    wherein the housing of the optical transceiver forms a gap against the metal cage, and
    wherein the ground finger includes a plurality of fingers each forming a gap against neighbor finger to leak the EMI radiation therethrough.

* * * * *